(12) United States Patent
Martin et al.

(10) Patent No.: US 7,834,829 B2
(45) Date of Patent: Nov. 16, 2010

(54) CONTROL CIRCUIT FOR OVERCOMING STICTION

(75) Inventors: Eric Martin, Corvallis, OR (US);
Arthur R. Piehl, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1109 days.

(21) Appl. No.: 11/242,307

(22) Filed: Oct. 3, 2005

(65) Prior Publication Data

US 2007/0075942 A1 Apr. 5, 2007

(51) Int. Cl.
*G09G 3/34* (2006.01)
(52) U.S. Cl. .......................... 345/85; 345/84
(58) Field of Classification Search ............. 345/85, 345/84; 313/146, 511; 359/230, 290–295; 324/661
See application file for complete search history.

(56) References Cited

U.S. PATENT DOCUMENTS

| | | | | | |
|---|---|---|---|---|---|
| 5,343,766 | A | * | 9/1994 | Lee ........................ | 73/862.61 |
| 5,748,004 | A | * | 5/1998 | Kelly et al. ................ | 324/661 |
| 6,525,483 | B1 | * | 2/2003 | Van Gorkom et al. .... | 315/169.1 |
| 6,829,132 | B2 | | 12/2004 | Martin et al. | |
| 6,987,601 | B2 | * | 1/2006 | Kaeriyama ................. | 359/295 |
| 7,463,403 | B1 | * | 12/2008 | Gaalema et al. ........... | 359/290 |
| 2002/0012159 | A1 | | 1/2002 | Tew | |
| 2004/0008396 | A1 | | 1/2004 | Stappaerts | |
| 2006/0119922 | A1 | * | 6/2006 | Faase et al. ................ | 359/290 |
| 2007/0008260 | A1 | * | 1/2007 | Van Gorkom et al. ...... | 345/85 |

FOREIGN PATENT DOCUMENTS

| | | |
|---|---|---|
| EP | 1 473 581 A2 | 11/2004 |
| EP | 1 473 691 A | 11/2004 |

OTHER PUBLICATIONS

Kevin F. Harsh, Dealing with MEMS stiction and other sticking problems, Ph.D. Research Assistant, University of Colorado, 2000, pp. 1-4, University of Colorado, U.S.A.
Pierre Dupont et al., Elasto-Plastic Friction Model: Contact Compliance and Stiction, 2000 ACC; Chicago: AACC; Jun. 2000; Aug. 9, 2004, pp. 1-7.
B. Parvais, et al., A Fluoro-ethoxysilane-Based Stiction-Free Release Process for Submicron Gap MEMS, Universit'e catholique de Louvain, BE, pp. 522-525.
MicroSurfaces, Inc., Anti-Stiction Coatings in MEMS Devices, Surface technology form the MEMS industry, pp. 1-3, http://memsurface.com/stiction.html.

* cited by examiner

*Primary Examiner*—Amr Awad
*Assistant Examiner*—Aaron Midkiff

(57) ABSTRACT

A circuit and method for controlling a micro-electromechanical system is herein disclosed. In one embodiment of a micro-electromechanical system having top and bottom capacitor plates with a pixel plate movably positioned therebetween, a release voltage sufficient to overcome stiction forces adhering the pixel plate to one of the capacitor plates is applied to the pixel plate to cause the pixel plate to be attracted to the pixel plate opposite the capacitor plate to with which the pixel plate is in contact. After the pixel plate has moved a predetermined distance away from the capacitor plate to which it had been adhered by stiction forces, the release voltage is removed. Thereafter, an positional voltage is applied to the pixel plate to move the pixel plate to a desired location between the capacitor plates. Release and positional voltages are coupled to and decoupled from the pixel plate by one or more switching mechanisms.

29 Claims, 4 Drawing Sheets

US 7,834,829 B2

CONTROL CIRCUIT FOR OVERCOMING STICTION

TECHNICAL FIELD OF THE INVENTION

The present invention relates to a circuit and control method for overcoming stiction in micro-electromechanical systems.

BACKGROUND OF THE INVENTION

Micro-electromechanical systems (MEMS) are systems which are developed using thin film technology and which include both electrical and micro-mechanical components. MEMS devices are used in a variety of applications such as optical display systems, pressure sensors, flow sensors and charge control actuators. MEMS devices use electrostatic force or energy to move or monitor the movement of micromechanical electrodes which can store charge. In one type of MEMS device, to achieve a desired result, a gap distance between the electrodes is controlled by balancing an electrostatic force and a mechanical restoring force. Digital MEMS devices use two gap distances, while analog MEMS devices use multiple gap distances.

MEMS functionality is often degraded or even destroyed by a phenomenon called stiction. Stiction is defined as the strong interfacial adhesion present between contacting crystalline microstructure surfaces. Because the structures of MEMS are so small, forces such as stiction may be stronger than the actuating forces applied to the MEMS and the inherent mechanical restoring forces that would tend to operate the MEMS in a desired manner.

To date, steps taken to ameliorate the problem of stiction have been related to limiting contact between the crystalline microstructure surfaces of MEMS. Attempts to solve the problem of stiction include super critical drying processes, chemical surface treatments and coatings, improved cleaning and etching processes, and the use of structural components adapted to minimize surface area contact. While these steps may reduce the effects of stiction to a degree, none have eliminated stiction as a factor in the operation of MEMS.

DETAILED DESCRIPTION

Figure 1:
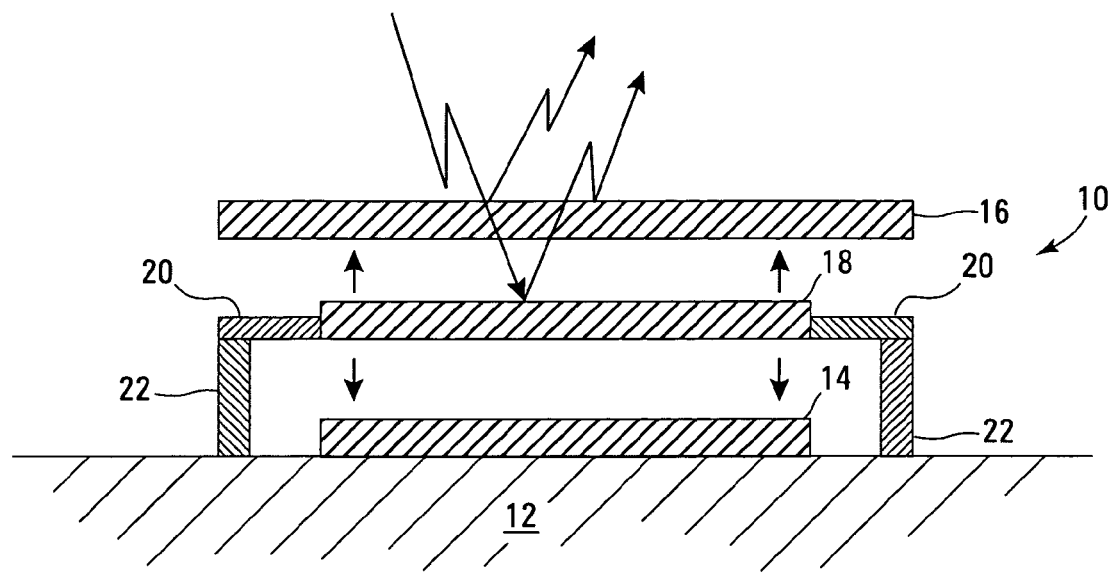
FIG. 1 is a schematic cross-sectional view of one embodiment of a MEMS that may be operated in accordance with one embodiment of the invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
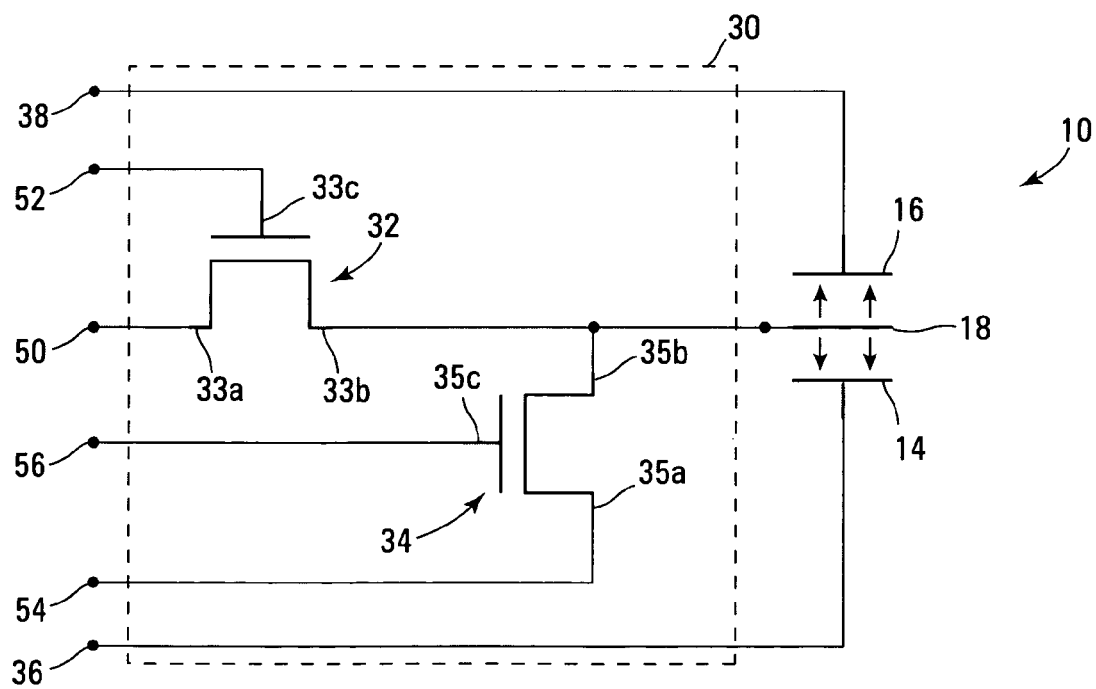
FIG. 2 is a circuit diagram showing one embodiment of a system for operating a MEMS; and, FIG. 3 is a flow chart illustrating an embodiment of a calibration process used to characterize the operation of a MEMS.

FIG. 1 illustrates one embodiment of a MEMS 10 adapted to be operated so as to overcome the effects of stiction. MEMS 10 is formed on a substrate 12 and includes a bottom capacitor plate 14, a top capacitor plate 16, and a pixel plate 18. The pixel plate 18 is supported by one or more flexures 20 that are in turn supported on one or more posts 22. Because the pixel plate 18 is mounted on the flexible flexures 20, it is moveable with respect to the bottom and top capacitor plates 14, 16, which are fixed in their location. The pixel plate 18 is electrically coupled through flexures 20 and legs 22 to a control circuit (see FIG. 2) that controls the charge applied thereto. Bottom and top capacitor plates 14 and 16 are typically coupled to separate voltage sources as shown in FIG. 2.

In one embodiment, bottom capacitor plate 14 is maintained at approximately zero (0) volts and top capacitor plate 16 is maintained at approximately fifteen (15) volts. It will be appreciated that these voltage values may be modified, so long as a sufficiently large voltage differential is maintained therebetween. By modifying the voltage level of the pixel plate 18 between the upper and lower limits set by the voltages of the bottom and top capacitor plates 14, 16, the position of the pixel plate 18 between the bottom and top capacitor plates 14,16 may be controlled. The particular relationship between the relative voltages of the bottom capacitor plate 14, top capacitor plate 16 and the pixel plate 18 depends on many factors, including, but not limited to, the structural characteristics of the MEMS 10 and particularly that of the flexures 20 and posts 22 and the capacitative characteristics of the bottom capacitor plate 14, top capacitor plate 16 and the pixel plate 18.

Figure 3:
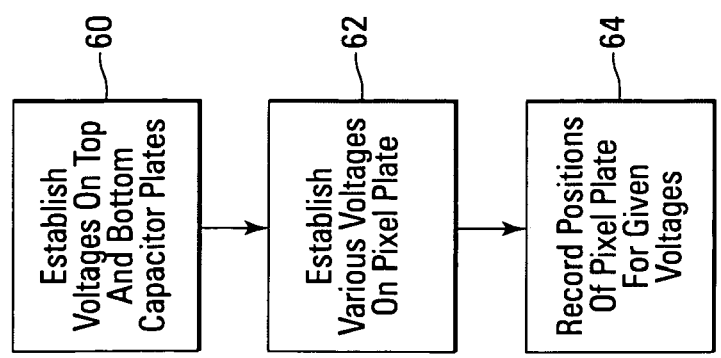

In one embodiment of the MEMS 10, the specific voltage-position relationship of the pixel plate 18 with respect to the bottom and top capacitor plates 14, 16 is determined by setting the voltages of the bottom and top capacitor plates 14, 16 to predetermined voltage levels as shown in FIG. 3 (step 60); applying various voltages to the pixel plate 18 (step 62), and recording the resulting positions of the pixel plate 18 (step 64). This calibration process may be carried out for various voltage settings of the bottom and top pixel plates 14, 16 to determine the location of the pixel plate 18 under various conditions. One or more sets of calibration data may then be stored for use in determining the position of the pixel plate 18 under the various recorded conditions. In other embodiments, the physical characteristics of the flexures 20 and the capacitative characteristics of the bottom and top capacitor plates 14, 16 and the pixel plate 18 are sufficiently well known that the position of the pixel plate 18 between the capacitor plates 14 and 15 may be directly calculated for given voltage values applied to the pixel plate 18.

In some embodiments, the voltage settings of the bottom and top capacitor plates 14, 16 remain substantially constant during operation of the MEMS 10. However, it is to be understood that the voltages of the bottom and top capacitor plates 14, 16 may also be varied to drive the pixel plate 18 into a desired location.

As described above, where the pixel plate 18 comes into contact with either of the bottom or top capacitor plates 14, 16, stiction will tend to keep the pixel plate 18 in contact with the respective capacitor plate. Because the force of stiction is generally greater than the forces required to move the pixel plate 18 to a desired location between the bottom and top capacitor plates 14, 16, the voltage differential that must exist between the pixel plate 18 and the respective capacitor plates must be sufficiently large to create an attraction between the pixel plate 18 and the opposing capacitor plate that will overcome the stiction force that adheres the pixel plate 18 to the capacitor plate it is in contact with. Since the attractive force needed to overcome the stiction forces is generally much larger than what is needed to move the pixel plate to a particular position between the respective capacitor plates, imposing and retaining such voltages upon the pixel plate 18 will tend to snap the pixel plate 18 into contact with the opposing capacitor plate. This results in a binary operation mode wherein the pixel plate 18 may be moved between a first position in which the pixel plate 18 is in contact with the bottom capacitor plate 14 and a second position in which the pixel plate 18 is in contact with the top capacitor plate 16 and vice versa. Where the MEMS 10 is intended for a binary mode of operation, this method of controlling the MEMS 10 may suffice. However, where it is desired to operate the MEMS 10 in a continuously variable, analog mode, the voltages applied to the pixel plate must be carefully controlled.

Operating MEMS 10 so as to overcome stiction and to subsequently position the pixel plate 18 in a desirable location between the bottom and top capacitor plates 14 and 16 requires the modification of the voltage applied to the pixel plate 18 over time frames that are a fraction of the time required for the pixel plate 18 to move from one capacitor plate to the other. Upon application of a release voltage to the pixel plate 18 and after the pixel plate 18 has been broken free of the capacitor plate to which it was adhered by stiction forces, the release voltage is removed from the pixel plate and a second voltage, referred to herein as a positional voltage is applied to the pixel plate. In other embodiments, the release voltage is simply increased or reduced to until the desired positional voltage level is reached. The interaction between the electromagnetic field on the pixel plate 18 and the respective electromagnetic fields on the bottom and top capacitor plates 14, 16 results in the pixel plate coming to rest in a desired location, the location being determined either through calibration as shown in FIG. 3 or by direct calculation gated on the characteristics of the MEMS 10. In one embodiment of a MEMS, the pixel plate 18 will travel from contact with one capacitor plate to contact with the opposing capacitor plate in a time on the order of 1 to 2 microseconds. In this embodiment, a release voltage sufficient to break the hold of stiction forces between the pixel plate and the capacitor plate to which it is adhered by stiction is applied to the pixel plate for a predetermined period of time, in one embodiment, approximately 20 nanoseconds. In one embodiment where the top capacitor plate 16 is maintained at 15 volts and the bottom capacitor plate is maintained at 0 volts, a voltage of approximately 7.5 volts is sufficient to release the pixel plate 18 from contact with either of the capacitor plates.

Once the initial time period during which the release voltage is applied to the pixel plate 18 has passed, the release voltage is decoupled from the pixel plate 18. The release voltage breaks the pixel plate free from the capacitor plate and starts the pixel plate 18 moving toward the opposing capacitor plate. Thereafter, the pixel plate 18 is allowed to travel for a predetermined period of time related to a desired distance traveled by the pixel plate, in one embodiment approximately 30 nanoseconds. At this stage, the positional voltage signal is applied to the pixel plate 18 to bring it to its desired position between the respective capacitor plates 14, 16. The positional voltage applied to the pixel plate 18 may be maintained for as long as that particular position is desired. In other embodiments, the pixel plate 18 is isolated and the positional voltage will be substantially maintained thereon by means of the capacitance of the pixel plate 18. Subsequent voltages (release or positional) may be applied to the pixel plate 18 to change its position or to overcome stiction forces, as needed.

It should be noted that the point at which positional voltages may be applied to the pixel plate 18 vary between MEMS embodiments; however, care must be taken to ensure that the positional voltage is applied to the pixel plate 18 at a time when the positional voltage is sufficient to prevent the pixel plate 18 from snapping back into contact with the capacitor plate from which it was just freed. While time is used herein to specify for how long voltage signals are to be applied to the pixel plate 18, it is to be understood that distance may be used as a criteria for determining when and for how long to apply a voltage to the pixel plate 18.

Figure 5:
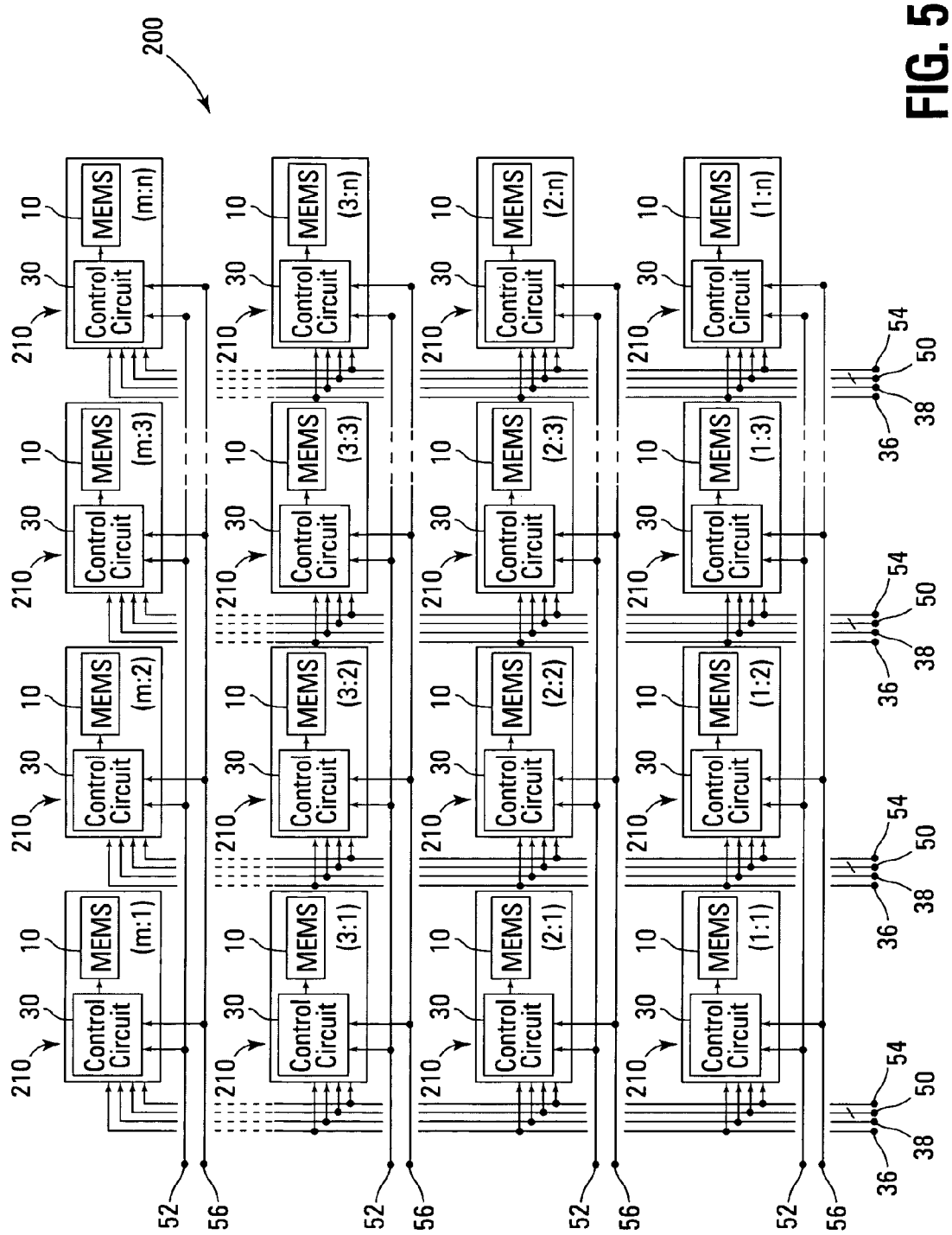
FIG. 5 is a schematic view of an embodiment of an array of MEMS and their attendant control circuits.

FIG. 2 illustrates one embodiment of a control circuit 30 adapted to control a MEMS 10. Taken together, MEMS 10 and control circuit 30 comprising a single cell 210 as illustrated in FIG. 5. Control circuit 30 modulates the voltages applied to the pixel plate 18 to vary the attraction between the respective capacitor plates and the pixel plate, thereby selecting the position the pixel plate with respect to the capacitor plates. Control circuit 30 also applies voltages to the pixel plate to overcome stiction forces that tend to adhere the pixel plate to the capacitor plates. In one embodiment, the control circuit 30 includes a pair of switching devices 32 and 34. The switching devices 32 and 34 are, in this embodiment, transistors, though the switching devices 32 and 34 may be any useful device, including, but not limited to, PMOS transistors, NMOS transistors, or a complimentary pass gate having PMOS and NMOS transistors connected in parallel. The switching devices 32 and 34 are coupled to the pixel plate 18 in such a manner as to facilitate the application of various voltages thereto. The bottom and top capacitor plates 14, 16 are coupled to respective bias voltage sources, 36 and 38 that apply voltages thereto so as to create a predetermined voltage differential therebetween.

Switching device 32, in this case represented as a basic transistor, has coupled to its source 33a a first voltage source 50 that is related to a desired position of the pixel plate 18 as determined in the calibration process described above. The drain 33b of switching device 32 is coupled to the pixel plate 18. The gate 33c of the switching device 32 is coupled to a first control voltage source 52 that selectively allows a signal to pass through the switching device 32 to the pixel plate 18.

The source 35a of switching device 34 is coupled to a second voltage source 54 that provides a signal whose magnitude is set so as to overcome the stiction forces that may be holding the pixel plate 18 in contact with one of the respective capacitor plates 14, 16. The drain 35b of the switching device is electrically connected to the pixel plate 18. The gate 35c of the switching device 34 is coupled to a second control voltage source 56 that selectively allows a signal to pass through the switching device 34 to the pixel plate 18.

Figure 4:
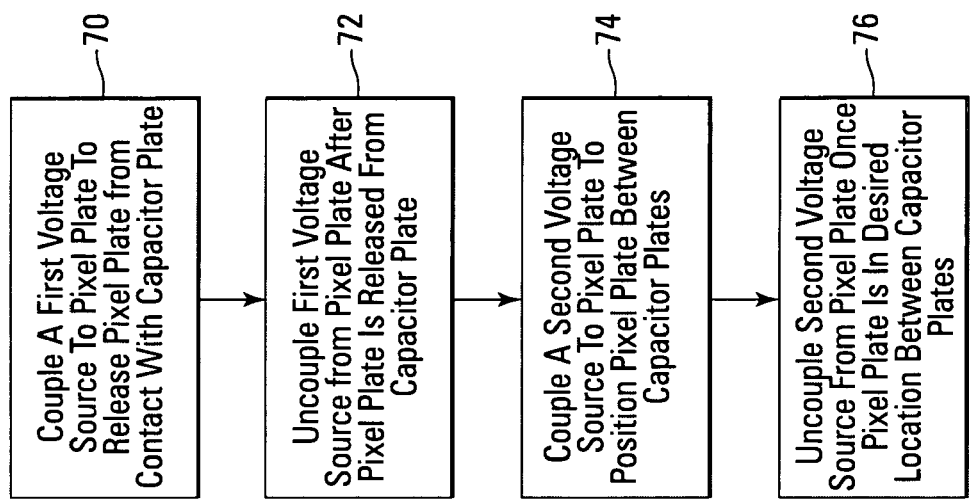
FIG. 4 is a flow chart illustrating one embodiment of a method for operating a MEMS to overcome stiction.

As can be seen in FIG. 4, one mode of operation of the MEMS 10 involves activating switching mechanism 32 to apply a first or release voltage to the pixel plate 18 to release the pixel plate 18 from the capacitor plate to which it is adhered by stiction forces (step 70). Once the pixel plate 18 has traveled a predetermined distance, as measured in some embodiments by the passage of time, switching mechanism 32 is again activated to decouple the release voltage from the pixel plate (step 72). Thereafter, switching mechanism 34 is activated to apply a second or positional voltage to the pixel plate 18, which brings the pixel plate 18 to a predetermined location between the capacitor plates 14, 16. As noted above, switching mechanism 34 may optionally be activated to decouple the positional voltage from the pixel plate 18, the positional voltage being substantially maintained by the capacitance of the pixel plate 18 (step 76).

Where the MEMS 10 is to be operated in a binary fashion, steps 70 and 72 will suffice to break the pixel plate 18 away from the capacitor plate to which it is adhered by stiction forces and to move the pixel plate 18 into contact with the opposite capacitor plate.

In one embodiment the MEMS 10 is adapted to operate as an optical device, specifically a Fabry-Perot interferometer, though it is to be understood that the MEMS 10 may be adapted or constructed to function as an optical reflecting or modulation device other than an interferometer. Where the MEMS 10 is adapted to operate as an interferometer, the top capacitor plate 16 will be a filter, polarizer, or other type of reflector that reflects a portion of the light incident thereon and passes another portion therethrough. The pixel plate 18 is similarly adapted as a filter, polarizer, or other reflector that reflects at least a portion of the light incident thereon back through the top capacitor plate 16, the light reflected from the pixel plate 18 being out of phase with the light being reflected from the top capacitor plate 16, the light being reflected from the MEMS 10 in general will be the result of the interference between the out of phase light reflected from the top capacitor plate 16 and the pixel plate 18, respectively.

While the invention has been heretofore described in the context of a single control circuit 30 operating a single MEMS 10, it is to be understood that multiple cells 210 of control circuits 30 and MEMS 10, respectively, may be assembled into an array 200 as seen in FIG. 5. Array 200 has 'm' rows and 'n' columns of cells 210. In one embodiment, control voltages 52 and 56 are common to each of the cells 210 as the timing whereby switching devices 32 and 34 are activated is common to all cells 210 in the array 200, i.e. all cells 210 are cycled together. Leads 36 and 38 are coupled to each of the bottom and top capacitor plates 14, 16 as described in conjunction with FIG. 2. Note that one of the leads 36 and 38 may in some embodiments be connected to ground. Lead 54 is common to all cells 210 and provides the requisite release voltages to the MEMS 10. Lead 50 in FIG. 5 is illustrated as a single lead; however, it is to be understood that lead 50 may be multiple wires or leads as the positional voltages applied to a given cell 210 in the array 200 may need to be different from all other positional voltages applied to the respective MEMS 10 of cells 210. Where an array 200 of cells 210 is employed as an optical display, the array 200 will be cyclically controlled to produce images, text, and the like.

In an exemplary embodiment, the positional voltage is a column signal, such that all cells in a particular column are connected to the same lead 50 (FIG. 5). In an m×n array, there would be n column voltage lines. Control signals 52 and 56 are row control signals. All cells in a particular row use the same row control signal 52 and row control signal 56. In an m×n array, there would be m 52's and m 56's. Signals 38, 36, and 54 would all be global biases. The array can be "written", or actuated, one row at a time.

Figure 6:
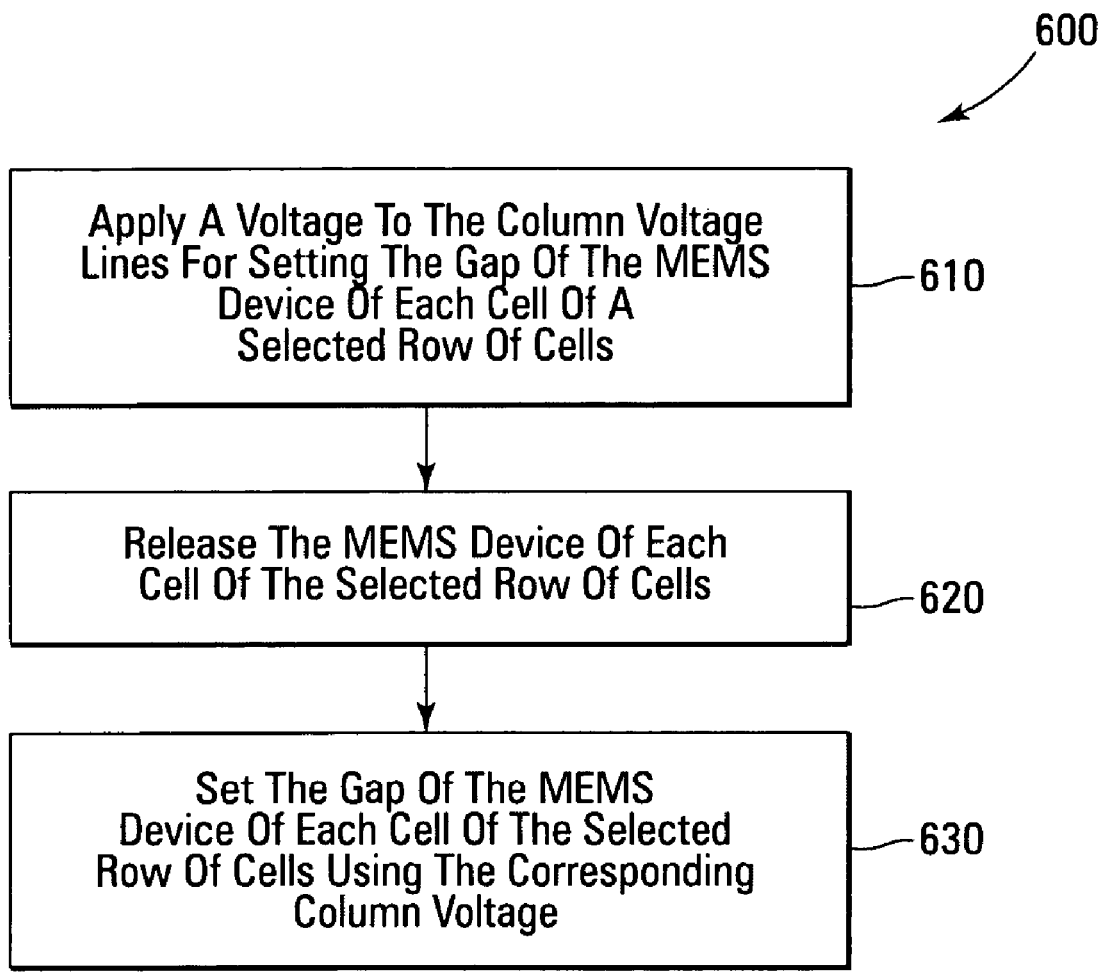
FIG. 6 is a flowchart of an embodiment of a method for writing to an array of micro-electromechanical system cells, according to an embodiment of the invention.

FIG. 6 is a flowchart of a method 600 for writing to a selected row of cells 210. At block 610 a voltage is applied to each of the column voltage lines for setting the gap of the MEMS device of each cell of the selected row of cells. The MEMS device of each the cells of the selected row of cells is released, e.g., by pulsing the row control signal 56 corresponding to the selected row of cells at block 620. At block 630, the gap of the MEMS device of each cell of the selected row of cells is set using the corresponding applied column voltage. This may be accomplished by coupling the MEMS device of each cell of the selected row of cells to the corresponding applied column voltage by pulsing the row control signal 52 corresponding to the selected row of cells. To write to array 200, the above method is applied to each row of the array.

Conclusion

Although specific embodiments of a circuit and control method for overcoming stiction in micro-electromechanical systems have been illustrated and described herein, it is manifestly intended that this invention be limited only by the following claims and equivalents thereof.

What is claimed is:

1. A control circuit for a micro-electromechanical system comprising:

a micro-electromechanical system having a first capacitor plate, a second capacitor plate, and a moveable pixel plate positioned between the first and second capacitor plates so that the moveable pixel plate overlies the first capacitor plate and the second capacitor plate overlies the moveable pixel plate, the first capacitor plate being electrically coupled to a first voltage source, the second capacitor plate being electrically coupled to a second voltage source, the first and second voltage sources defining a voltage differential therebetween; and a switching circuit electrically coupled to the moveable pixel plate, the switching circuit comprising a first switching means and a second switching means, the first switching means being electrically coupled between a release voltage source and the moveable pixel plate for selectively applying a non-zero release voltage to the moveable pixel plate from the release voltage source at least while the moveable pixel plate is adhered to one of the first and the second capacitor plates for releasing the moveable pixel plate from the one of the first and the second capacitor plates to which the moveable pixel plate is adhered, the second switching means being electrically coupled between a positional voltage source and the moveable pixel plate for selectively applying a positional voltage to the moveable pixel plate from the positional voltage source when the moveable pixel plate is not adhered to either the first capacitor plate or the second capacitor plate.

2. The control circuit for a micro-electromechanical system of claim 1 wherein the first switching means is a transistor having a source that is coupled to the release voltage source, a gate that is coupled to a release control voltage, and a drain coupled to the moveable pixel plate and wherein the second switching means is a transistor having a source that is coupled to the positional voltage source, a gate that is coupled to a positional control voltage, and a drain coupled to the moveable pixel plate.

3. The control circuit for a micro-electromechanical system of claim 1 wherein the first and second switching means are adapted to selectively couple the respective release and positional voltage sources to the moveable pixel plate over a period of time that is less than the time required for the moveable pixel plate to move between the first and second capacitor plates.

4. The control circuit for a micro-electromechanical system of claim 1 wherein the micro-electromechanical system comprises an optical device.

5. The control circuit for a micro-electromechanical system of claim 1 wherein the micro-electromechanical system comprises an interferometer.

6. The control circuit for a micro-electromechanical system of claim 1 wherein the micro-electromechanical system and its attendant control circuit comprises at least a portion of an array of micro-electromechanical systems and their attendant control circuits.

7. The control circuit for a micro-electromechanical system of claim 6 wherein the array of micro-electromechanical systems and their attendant control circuits comprises a display.

8. A control circuit for a micro-electromechanical system comprising:
a switching circuit electrically coupled to a moveable element of the micro-electromechanical system that is moveably positioned between first and second capacitor plates of the micro-electromechanical system so that the moveable element overlies the first capacitor plate and the second capacitor plate overlies the moveable element, the switching circuit comprising a first switching device and a second switching device, the first switching device being electrically coupled between a release voltage source and the moveable element for selectively applying a non-zero release voltage to the moveable element from the release voltage source at least while the moveable element is adhered to one of the first and the second capacitor plates for releasing the moveable element from the one of the first and the second capacitor plates to which the moveable element is adhered, the second switching device being electrically coupled between a positional voltage source and the moveable element for selectively applying a positional voltage to the moveable element from the positional voltage source when the moveable element is not adhered to either the first capacitor plate or the second capacitor plate.

9. The control circuit for a micro-electromechanical system of claim 8 wherein each of the first and second capacitor plates is electrically coupled to a distinct voltage source such that a voltage differential is defined between the first and second capacitor plates.

10. The control circuit for a micro-electromechanical system of claim 8 wherein the first switching device of the switching circuit is a transistor having a source that is coupled to the release voltage source, a gate that is coupled to a release control voltage, and a drain coupled to the moveable element of the micro-electromechanical system and wherein the second switching device of the switching circuit is a transistor having a source that is coupled to the positional voltage source, a gate that is coupled to a positional control voltage, and a drain coupled to the moveable element of the micro-electromechanical system.

11. The control circuit for a micro-electromechanical system of claim 9 wherein the first and second switching devices of the switching circuit are adapted to selectively couple the respective release and positional voltage sources to the moveable element of the micro-electromechanical system over a period of time that is less than the time required for the moveable element of the micro-electromechanical system to move between the first and second capacitor plates.

12. The control circuit for a micro-electromechanical system of claim 9 wherein the micro-electromechanical system comprises an interferometer.

13. The control circuit for a micro-electromechanical system of claim 8 wherein the micro-electromechanical system and its attendant switching circuit comprises at least a portion of an array of micro-electromechanical systems and their attendant switching circuits.

14. The control circuit for a micro-electromechanical system of claim 13 wherein the array of micro-electromechanical systems and their attendant switching circuits comprises a display.

15. An array of micro-electromechanical system cells comprising:
a micro-electromechanical system electrically coupled to a switching circuit, the micro-electromechanical system having a first capacitor plate, a second capacitor plate, and a moveable pixel plate positioned between the first and second capacitor plates so that the moveable pixel plate overlies the first capacitor plate and the second capacitor plate overlies the moveable pixel plate, the first capacitor plate being electrically coupled to a first voltage source, the second capacitor plate being electrically coupled to a second voltage source, the first and second voltage sources defining a voltage differential therebetween, the switching circuit being electrically coupled to the moveable pixel plate, the switching circuit comprising a first switching device and a second switching device, the first switching device being electrically coupled between a release voltage source and the moveable pixel plate for selectively applying a non-zero release voltage to the moveable pixel plate from the release voltage source at least while the moveable pixel plate is adhered to one of the first and the second capacitor plates for releasing the moveable pixel plate from the one of the first and the second capacitor plates to which the moveable pixel plate is adhered, the second switching device being electrically coupled between a positional voltage source and the moveable pixel plate for selectively applying a positional voltage to the moveable pixel plate from the positional voltage source when the moveable pixel plate is not adhered to either the first capacitor plate or the second capacitor plate.

16. The array of micro-electromechanical system cells of claim 15 wherein the array comprises a display.

17. The array of micro-electromechanical system cells of claim 15 wherein the first switching device is a transistor having a source that is coupled to the release voltage source, a gate that is coupled to a release control voltage, and a drain coupled to the moveable pixel plate and wherein the second switching device is a transistor having a source that is coupled to the positional voltage source, a gate that is coupled to a positional control voltage, and a drain coupled to the moveable pixel plate.

18. The array of micro-electromechanical system cells of claim 17 wherein the first and second switching devices are adapted to selectively couple the respective release and positional voltage sources to the moveable pixel plate over a period of time that is less than the time required for the moveable pixel plate to move between the first and second capacitor plates.

19. The array of micro-electromechanical system cells of claim 15 wherein the micro-electromechanical system comprises an optical device.

20. The array of micro-electromechanical system cells of claim 19 wherein the micro-electromechanical system comprises an interferometer.

21. A method of controlling a micro-electromechanical system comprising:
applying a first bias voltage to a first capacitor plate;

applying a second bias voltage to a second capacitor plate, the second bias voltage being different than the first bias voltage;

activating a first switching device coupled between a first voltage source and a moveable pixel plate to couple a non-zero release voltage to the moveable pixel plate from the first voltage source at least while the moveable pixel plate is adhered to one of the first and second capacitor plates by stiction forces for releasing the moveable pixel plate from the one of the first and second capacitor plates to which the moveable pixel plate is adhered, wherein the moveable pixel plate is positioned between the first and second capacitor plates so that the moveable pixel plate overlies the first capacitor plate and the second capacitor plate overlies the moveable pixel plate, the release voltage being sufficient to overcome the stiction forces adhering the moveable pixel plate to the one of the first and second capacitor plates;

activating the first switching device to decouple non-zero the release voltage from the moveable pixel plate after the moveable pixel plate is released from the one of the first and second capacitor plates to which the moveable pixel plate was adhered; and, activating a second switching device coupled between a second voltage source and the moveable pixel plate to couple a positional voltage from the second voltage source to the moveable pixel plate when the moveable pixel plate is not adhered to either the first capacitor plate or the second capacitor plate.

22. The method of controlling a micro-electromechanical system of claim 21 wherein applying a first bias voltage comprises applying approximately fifteen (15) volts and wherein applying a second bias voltage comprises applying approximately zero (0) volts.

23. The method of controlling a micro-electromechanical system of claim 21 wherein activating a first switching device to couple a non-zero release voltage comprises coupling the non-zero release voltage to the moveable pixel plate by the first switching device for approximately 20 nanoseconds.

24. The method of controlling a micro-electromechanical system of claim 21 further comprising, after the non-zero release voltage is decoupled from the moveable pixel plate, allowing the moveable pixel plate to move for approximately thirty (30) nanoseconds before the second switching device couples the positional voltage to the moveable pixel plate.

25. The method of controlling a micro-electromechanical system of claim 21 further comprising activating the second switching device to decouple the positional voltage from the moveable pixel plate.

26. The method of controlling a micro-electromechanical system of claim 25 wherein the moveable pixel plate retains the charge applied thereto by coupling the moveable pixel plate to the positional voltage source until the moveable pixel plate is again coupled to the release voltage source at the beginning of a subsequent control cycle.

27. A method of writing to an array of micro-electromechanical system cells, comprising:

applying a first voltage to each of a plurality of first column lines of the array for setting a gap of a MEMS device of each cell of a selected row of cells;

applying a second voltage to each of a plurality of second column lines of the array for releasing the MEMS device of each cell of the selected row of cells;

releasing the MEMS device of each cell of the selected row of cells using a non-zero corresponding applied second voltage; and setting the gap of the MEMS device of each cell of the selected row of cells using a corresponding applied first voltage;

wherein releasing the MEMS device of each cell of the selected row of cells comprises coupling a non-zero corresponding applied second voltage to a moveable pixel plate of the MEMS device of the respective cell at least while the moveable pixel plate is in contact with one of a first and a second capacitor plate of the MEMS device of the respective cell to move the moveable pixel plate out of contact with the one of the first and the second capacitor plate of the MEMS device of the respective cell, wherein the moveable pixel plate overlies the first capacitor plate and the second capacitor plate overlies the moveable pixel plate, wherein the corresponding applied second voltage is coupled to the moveable pixel plate by activating a first switch of the respective cell coupled between the corresponding applied second voltage and the moveable pixel plate, wherein the first switch is activated by pulsing a row control signal corresponding to the selected row of cells and electrically coupled to the first switch of the respective cell; and wherein setting the gap of the MEMS device of each cell of the selected row of cells comprises setting a position of the moveable pixel plate of the MEMS device of the respective cell between the first and second capacitor plates of the MEMS device of the respective cell, wherein setting the position of the moveable pixel plate of the MEMS device of the respective cell between the first and second capacitor plates of the MEMS device of the respective cell comprises coupling the corresponding applied first voltage to the moveable pixel plate when the moveable pixel plate is no longer in contact with the one of a first and a second capacitor plate of the MEMS device of the respective cell to move the moveable pixel plate to the position between the first and second capacitor plates, wherein the corresponding applied first voltage is coupled to the moveable pixel plate by activating a second switch of the respective cell coupled between the corresponding applied first voltage and the moveable pixel plate, wherein the second switch is activated by pulsing another row control signal corresponding to the selected row of cells and electrically coupled to the second switch of the respective cell.

28. The method of claim 27, wherein the first switch of the respective cell is a transistor having a source that is coupled to the corresponding applied second voltage, a gate that is coupled to the row control signal corresponding to the selected row of cells, and a drain coupled to the moveable pixel plate of the MEMS device of the respective cell and wherein the second switch of the respective cell is a transistor having a source that is coupled to the corresponding applied first voltage, a gate that is coupled to the other row control signal corresponding to the selected row of cells, and a drain coupled to the moveable pixel plate of the MEMS device of the respective cell.

29. The method of 21, wherein the first switching device is a transistor having a source that is coupled to the first voltage source, a gate that is coupled to a release control voltage, and a drain coupled to the moveable pixel plate and wherein the second switching means is a transistor having a source that is coupled to the second voltage source, a gate that is coupled to a positional control voltage, and a drain coupled to the moveable pixel plate.

* * * * *

UNITED STATES PATENT AND TRADEMARK OFFICE
CERTIFICATE OF CORRECTION

| | | |
|---|---|---|
| PATENT NO. | : 7,834,829 B2 | Page 1 of 1 |
| APPLICATION NO. | : 11/242307 | |
| DATED | : November 16, 2010 | |
| INVENTOR(S) | : Eric Martin et al. | |

It is certified that error appears in the above-identified patent and that said Letters Patent is hereby corrected as shown below:

In column 9, lines 19-20, in Claim 21, delete "non-zero the" and insert -- the non-zero --, therefor.

Signed and Sealed this
Eighth Day of March, 2011

David J. Kappos
*Director of the United States Patent and Trademark Office*